US008966163B2

(12) United States Patent
Joo

(10) Patent No.: US 8,966,163 B2
(45) Date of Patent: Feb. 24, 2015

(54) NON-VOLATILE MEMORY DEVICE AND METHOD FOR PROGRAMMING THE SAME

(71) Applicant: SK Hynix Inc., Icheon (KR)

(72) Inventor: Seok Jin Joo, Seoul (KR)

(73) Assignee: SK Hynix Inc., Icheon (KR)

( * ) Notice: Subject to any disclaimer, the term of this patent is extended or adjusted under 35 U.S.C. 154(b) by 161 days.

(21) Appl. No.: 13/722,932

(22) Filed: Dec. 20, 2012

(65) Prior Publication Data

US 2013/0304966 A1   Nov. 14, 2013

(30) Foreign Application Priority Data

May 14, 2012   (KR) ........................ 10-2012-0050959

(51) Int. Cl.
*G06F 12/02*   (2006.01)

(52) U.S. Cl.
CPC .... *G06F 12/0246* (2013.01); *G06F 2212/7205* (2013.01); *G11C 2211/5641* (2013.01)
USPC ........... 711/103; 711/154; 711/156; 711/163; 365/185.33

(58) Field of Classification Search
CPC .................... G06F 12/0246; G06F 2212/7205; G11C 2211/5641
USPC .............. 711/103, 154, 156, 163; 365/185.33
See application file for complete search history.

(56) References Cited

U.S. PATENT DOCUMENTS

| 7,853,756 | B2 * | 12/2010 | Ukai | 711/152 |
| 8,301,912 | B2 * | 10/2012 | Lin et al. | 713/193 |
| 8,312,203 | B2 * | 11/2012 | Mizushima | 711/103 |
| 8,595,593 | B2 * | 11/2013 | Joo | 714/766 |
| 8,694,720 | B2 * | 4/2014 | Lee et al. | 711/103 |
| 2011/0208898 | A1 * | 8/2011 | Shin | 711/103 |

* cited by examiner

*Primary Examiner* — Stephen Elmore

(57) ABSTRACT

A non-volatile memory device and a method for programming the same are disclosed. The non-volatile memory device includes first and second memory blocks, each of which includes a plurality of memory cells, each memory cell including a plurality of regions in which data is written, corresponding regions of the plurality of memory cells constituting a page; a data write unit, upon receiving a write signal and an address allocation signal, configured to write first data in a first page of the first memory block, and write second data in a first page of the second memory block; and a copy-back unit, upon receiving a chip idle signal and a copy-back control signal, configured to write the first data written in the first memory block into a second page of the second memory block.

20 Claims, 6 Drawing Sheets

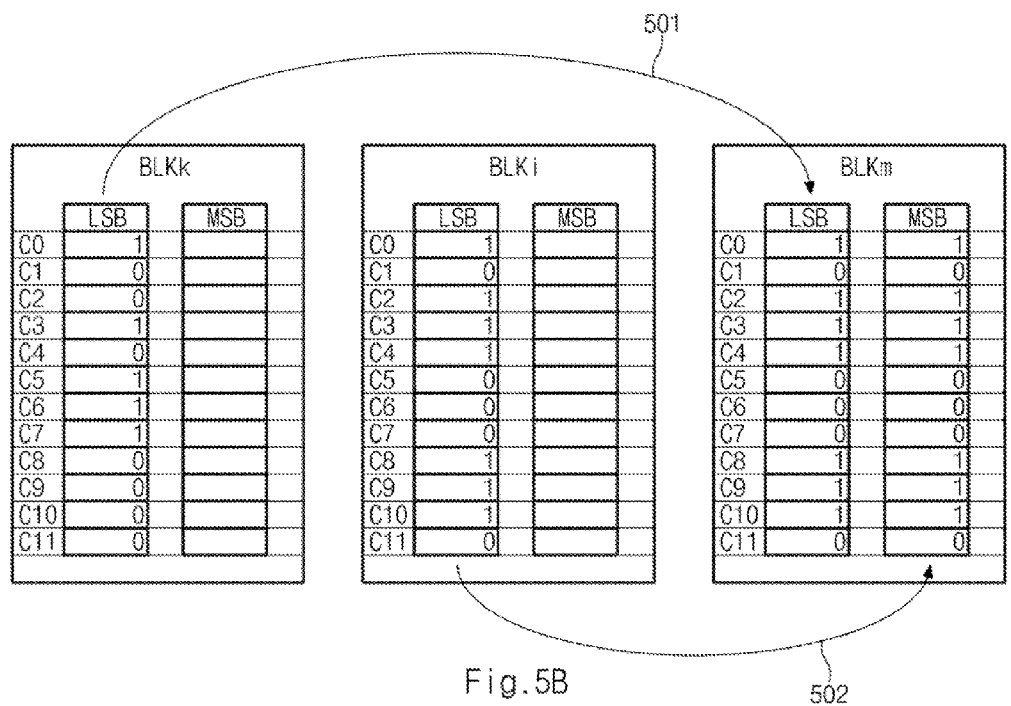

NON-VOLATILE MEMORY DEVICE AND METHOD FOR PROGRAMMING THE SAME

CROSS-REFERENCE TO RELATED APPLICATION

The priority of Korean patent application No. 10-2012-0050959 filed on May 14, 2012, the disclosure of which is hereby incorporated in its entirety by reference, is claimed.

BACKGROUND OF THE INVENTION

Embodiments of the present invention relate to a non-volatile memory device, and more particularly, to a non-volatile memory device including a memory cell array where data is programmed and a method for programming the non-volatile memory device, using a pseudo Single Level Cell (SLC) buffer scheme and a Multi Level Cell (MLC) scheme.

Flash memory serving as a non-volatile memory device has higher stability and lower power consumption than a hard disk drive (HDD). The above-mentioned advantages of the flash memory are appropriate for miniaturization of electronic appliances, so that the demand for flash memories is rapidly increasing.

The flash memory performs three operations, i.e., a read operation, a write (program) operation, and an erase operation. The read and write operations are carried out on a page basis, and the erase operation is carried out on a block basis. Characteristics of the flash memory include having different operation units where a plurality of pages in one block is sequentially used. Due to the above-mentioned characteristics of the flash memory, a system designed to use the flash memory converts a logical address of a higher layer into a physical address of the flash memory using a flash translation layer (FTL), such that the flash memory can access the desired data according to the physical address.

BRIEF SUMMARY OF THE INVENTION

Various embodiments of the present invention are directed to providing a non-volatile memory device and a method for programming the same, which substantially obviate one or more problems due to limitations and disadvantages of the related art.

An embodiment of the present invention relates to a non-volatile memory device and a method for programming the same. In particular, in a program operation of the non-volatile memory device, data that is sequentially input is written at a least significant bit (LSB) in a first region, and then a copy-back operation for moving the data written in the LSB to a most significant bit (MSB) in a second region is carried out during a background operation. As a result, a program time that a user recognizes is reduced.

An embodiment of the present invention relates to a non-volatile memory device and a method for programming the same. In particular, when data is sequentially written in memory cells in the non-volatile memory device, after the non-volatile memory device has been programmed using a single level cell (SLC) scheme having a relatively short program time, the non-volatile memory device is programmed using a multi level cell (MLC) scheme during a background operation that a user does not recognize. As a result, a degree of integration capable of satisfying the MLC scheme is achieved, and a program time is reduced.

An embodiment of the present invention relates to a non-volatile memory device and a method for programming the same. In particular, a memory cell capable of being programmed using an MLC scheme and a memory cell capable of being programmed using a pseudo (virtual) SLC buffer scheme are allocated with a predetermined ratio to the non-volatile memory device during an operation time that a user recognizes. As a result, it is possible to control the entire operation time of the non-volatile memory device and a requested degree of integration of a memory cell array.

In accordance with one embodiment of the present invention, a non-volatile memory device includes first and second memory blocks, each of which includes a plurality of memory cells, each memory cell including a plurality of regions in which data is sequentially written, corresponding regions of the plurality of memory cells constituting a page; a data write unit, upon receiving a write signal and an address allocation signal, configured to write first data in a first page of the first memory block, and write second data in a first page of the second memory block; and a copy-back unit, upon receiving a chip idle signal and a copy-back control signal, configured to write the first data written into the first memory block in a second page of the second memory block.

The first page may include a least significant bit (LSB) region of each of the plurality of memory cells, and the second page may include a most significant bit (MSB) region of each of the plurality of memory cells.

The first memory block and the second memory block may be contiguous to each other.

The non-volatile memory device may further include a write controller configured to generate the address allocation signal based on an address signal to allocate the first data to the first memory block and the second data to the second memory block.

The write controller may generate a write mode signal to determine a scheme for writing data in the memory blocks based on the address signal and a command signal including the write signal.

The write mode signal may be generated to determine the number of pages used when data is written in the memory blocks.

If data is written in a single page of a memory block, the data write unit may determine the memory block to be a single level cell (SLC) buffer, and if the data is written in a plurality of pages of the memory block, the data write unit may determine the memory block to be a multi level cell (MLC), such that the data write unit can perform a data write operation.

The chip idle signal may be included in the command signal, or the write controller may generate the chip idle signal if the command signal is not input thereto for a predetermined time.

In accordance with another embodiment of the present invention, a non-volatile memory device includes first to third memory blocks, each of which includes a plurality of memory cells, each memory cell including a plurality of regions in which data is sequentially written, corresponding regions of the plurality of memory cells constituting a page; a data write unit, upon receiving a write signal and an address allocation signal, configured to write first data in a first page of the first memory block, and write second data in a first page of the second memory block; and a copy-back unit, upon receiving a chip idle signal and a copy-back control signal, configured to write the first data written in the first memory block and the second data written in the second memory block in a first page and a second page of the third memory block, respectively.

The first page may include a least significant bit (LSB) region of each of the plurality of memory cells, and the second page may include a most significant bit (MSB) region of each of the plurality of memory cells.

The non-volatile memory device may further include a write controller which generates the address allocation signal based on an address signal to allocate the first data to the first memory block and the second data to the second memory block, generates a write mode signal to determine a scheme for writing data in the memory blocks upon receiving the address signal and a command signal including a read signal, and generates the copy-back control signal based on the address signal.

The write mode signal may be generated to enable data to be written in each of the memory blocks using a pseudo single level cell (SLC) buffer scheme or a multi level cell (MLC) scheme, and the write controller may determine a ratio of the pseudo SLC buffer scheme to the MLC scheme for the memory blocks based on the write mode signal.

In accordance with another embodiment of the present invention, a method for programming a non-volatile memory device including a plurality of memory blocks, each of which includes a plurality of memory cells, each memory cell including a plurality of regions in which data is sequentially written, corresponding regions of the plurality of memory cells constituting a page. The method includes providing, by a write controller, a write signal and an address allocation signal based on a command signal and an address signal; sequentially writing, by a data writing unit, data in a first page of a first memory block and a first page of a second memory block in response to the write signal and the address allocation signal; and copying-back, by a copy-back unit the data written in the first page of the first memory block into a second page of the second memory block in response to a chip idle signal and a copy-back control signal.

The method may further include generating the chip idle signal based on the command signal.

The method may further include generating a write mode signal to determine a scheme for writing data in each of the memory blocks, and performing the steps of sequentially writing the data and copying-back the data if the memory blocks are programmed using a pseudo single level cell (SLC) buffer scheme in response to the write mode signal.

Copying-back the data include: reading out the data written in the first memory block; and performing Most Significant Bit (MSB)-programming on the read-out data into the second page of the second memory block.

In accordance with another embodiment of the present invention, a method for programming a non-volatile memory device including a plurality of memory blocks, each of which includes a plurality of memory cells, each memory cell including a plurality of regions in which data is sequentially written, corresponding regions of the plurality of memory cells constituting a page. The method includes providing, by a write controller, a write signal and an address allocation signal based on a command signal and an address signal; sequentially writing, by a data writing unit, data in a first page of a first memory block and a first page of a second memory block in response to the write signal and the address allocation signal; and copying-back, by a copy-back unit, the data written in the first pages of the first and second memory blocks into first and second pages of a third memory block, respectively, in response to a chip idle signal and a copy-back control signal.

Copying-back operation the data may include reading out the data written in the first page of the first memory block and the data written in the first page of the second memory block, respectively; Least Significant Bit(LSB)-programming on the data read out of the first page of the first memory block into the first page of the third memory block; and Most Significant Bit(MSB)-programming on the data read out of the first page of the second memory block into the second page of the third memory block.

The method may further include erasing the data written in the first and second memory blocks.

The first page may include a least significant bit (LSB) region of each of the plurality of memory cells, and the second page may include a most significant bit (MSB) region of each of the plurality of memory cells.

It is to be understood that both the foregoing general description and the following detailed description of the present invention are exemplary and explanatory and are intended to provide further explanation of the invention as claimed.

BRIEF DESCRIPTION OF THE DRAWINGS

FIGS. 5A and 5B are conceptual diagrams illustrating a method for programming a non-volatile memory device according to another embodiment of the present invention.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

In association with the embodiments of the present invention, specific structural and functional descriptions are disclosed only for illustrative purposes, the embodiments of the present invention can be implemented in various ways without departing from the scope or spirit of the present invention.

Figure 1:
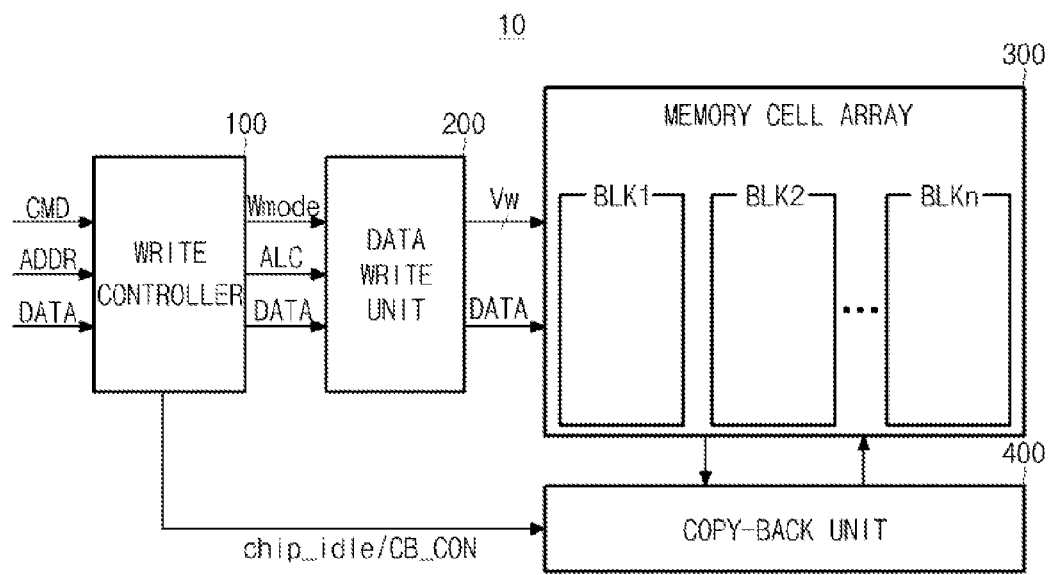
FIG. 1 illustrates a block diagram of a non-volatile memory device according to an embodiment of the present invention.

FIG. 1 illustrates a block diagram of a non-volatile memory device according to an embodiment of the present invention.

Referring to FIG. 1, the non-volatile memory device 10 includes a write controller 100, a data write unit 200, a memory cell array 300, and a copy-back unit 400. The memory cell array 300 includes a plurality of memory blocks, each memory block including a plurality of memory cells.

The write controller 100 receives a command signal CMD, an address signal ADDR and a data signal DATA from an external device such as a host, and generates a write mode signal Wmode and an address allocation signal ALC.

The write mode signal Wmode includes information as to whether each memory block in the memory cell array 300 is to be programmed using a pseudo SLC buffer scheme, information as to whether each memory block is to be programmed using an MLC scheme, and information as to whether each memory block is to be programmed using an SLC scheme. Memory cells are classified into an SLC for storing one-bit data and an MLC for storing two-bit data. In accordance with an embodiment of the present invention, a scheme for writing one-bit data in a memory cell is referred to as the SLC scheme, and a scheme for writing two-bit data in the memory cell is referred to as the MLC scheme. These data write schemes will be described later with reference to FIGS. 2A and 2B.

In accordance with the pseudo SLC buffer scheme, the non-volatile memory device is programmed using the SLC scheme having a relatively short write time during a program time, i.e., a chip activation period, recognized by a user. Thereafter, if the non-volatile memory device enters a chip idle mode in such a manner that the user cannot recognize an operation of the non-volatile memory device, data written according to the SLC scheme is copied back using the MLC scheme. In this case, the SLC-based programming indicates that an LSB page from among LSB and MSB pages of a plurality of memory cells is programmed.

The non-volatile memory device according to an embodiment of the present invention can perform a background operation in response to a chip idle signal chip_idle, and can enter the chip activation period in response to the command signal CMD such as a read signal, a write signal, etc.

In addition, a program scheme for each memory block can be established using the write mode signal Wmode. In conclusion, when programming a plurality of memory blocks, a ratio for performing specific program schemes can be determined in response to the write mode signal Wmode.

The ratio for performing the program scheme determined by the write mode signal Wmode may be controlled externally, and may be determined on the basis of a data write redundant space in the memory cell array 300. For example, since the MLC scheme and the SLC scheme are different from each other in terms of a write time, a rate of the pseudo SLC buffer scheme may increase to more quickly perform memory programming. However, during the chip activation period, if a space in which data is to be temporarily written in the memory cell array 300 using the SLC scheme is determined to be insufficient in size, a rate of the MLC scheme can increase instead of the pseudo SLC buffer scheme.

By means of the address allocation signal ACL, a memory block in which data is to be written can be allocated on the basis of the address signal ADDR according to the pseudo SLC buffer scheme. For example, the address allocation signal ACL may be used to allocate an address of a memory block to be used as a pseudo SLC buffer capable of temporarily storing data during the chip activation period. In addition, the address allocation signal ALC may be used to allocate an address of a memory block in which data is to be written using the MLC scheme during the chip activation period.

In accordance with an embodiment of the present invention, the write controller 100 generates a copy-back control signal CB_CON to the copy-back unit 400. In association with each memory block in which data is written in a first page, e.g., an LSB page, in response to the address allocation signal ALC, the copy-back control signal CB_CON may be used to indicate an operation for copying-back the data to a second page, e.g., an MSB page, of a specific memory block.

In accordance with an embodiment of the present invention, during the chip activation period, data can be written not only in a first page, e.g., an LSB page, of a first memory block but also in a first page of a second memory block in response to the address allocation signal ALC. Thereafter, when the background operation is performed in response to the chip idle signal chip_idle, the data written in the first memory block may be copied back into a second page, e.g., an MSB page, of the second memory block in response to the copy-back control signal CB_CON. In accordance with another embodiment of the present invention, depending on the copy-back control signal CB_CON generated during the background operation, the data written in the first memory block and the data written in the second memory block may be copied back into a first page and a second page of a third memory block, respectively.

In the copy-back operation, the data written in the LSB page is read out, and the acquired read-out data is finally shifted to the MSB page by repeating the LSB program and the MSB program. In accordance with an embodiment of the present invention, during the copy-back operation, the data written in the LSB page may be read out, the read-out data is stored in an arbitrary storage unit, and then programmed in a different memory block.

The data write unit 200 generates a write voltage Vw for writing data in the memory cell array 300 on the basis of the write mode signal Wmode, the address allocation signal ALC, and the data signal DATA. The write voltage Vw may include a program voltage Vpgm and a pass voltage Vpass, etc. In response to the address allocation signal ALC, different voltages are provided to a word line WL and a bit line BL in the memory cell array 300, such that data can be written in the memory cell array 300. In accordance with an embodiment of the present invention, sequentially-input data pieces can sequentially activate word lines WL of individual blocks in the memory cell array 300 and can be simultaneously written in the individual blocks.

The memory cell array 300 includes a plurality of memory blocks BLK1, BLK2, . . . , and BLKn, each of which includes a plurality of memory cells, and each memory cell includes a plurality of regions such as an LSB region and an MSB region. Each memory cell can store data of one or more bits. For convenience of description, it is assumed that 2 bits are stored in each memory cell according to an embodiment of the present invention. The plurality of memory blocks BLK1, BLK2, . . . , and BLKn includes a plurality of pages. For example, each of the memory blocks BLK1, BLK2, . . . , and BLKn may include an LSB page, which includes the LSB regions of the plurality of the memory cells, and an MSB page, which includes the MSB Regions of the plurality of the memory cells.

In response to the chip idle signal chip_idle, the copy-back unit 400 copies back data written in a first page of a first memory block to a second page of a second memory block. In the copy-back operation, the copy-back unit 400 reads out the data written in the first page of the first memory block, temporarily stores the read-out data, and then writes the stored data in the second page of the second memory block indicated by the copy-back control signal CB_CON.

In accordance with an embodiment of the present invention, a memory block to which data is finally moved after completion of the copy-back operation may be the memory block in which data is written in the first page during the chip activation period. In accordance with another embodiment of the present invention, the data may be copied back into a different memory block in which no data is written during the chip activation period.

In accordance with an embodiment of the present invention, although the chip idle signal chip_idle may be provided through the command signal CMD from an external device such as a host, the write controller 100 may generate the chip idle signal chip_idle when the command signal CMD is not provided thereto for a predetermined period of time.

In accordance with an embodiment of the present invention, data is programmed using the SLC scheme during the chip activation period, and the copied-back data may be erased from a memory block in which original data is written.

Figure 2A:
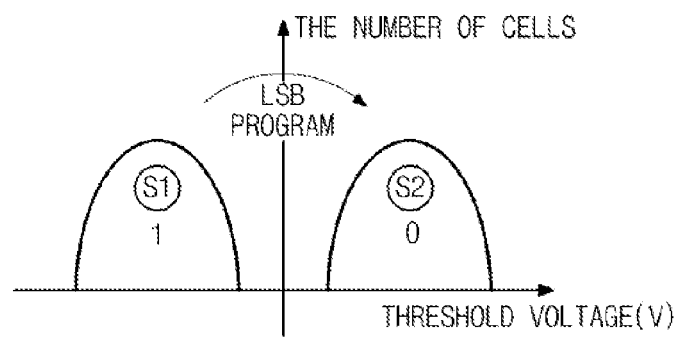
FIGS. 2A and 2B illustrate distribution of threshold voltages of memory cells to describe a scheme for programming pages according to an embodiment of the present invention.
Figure 2B:
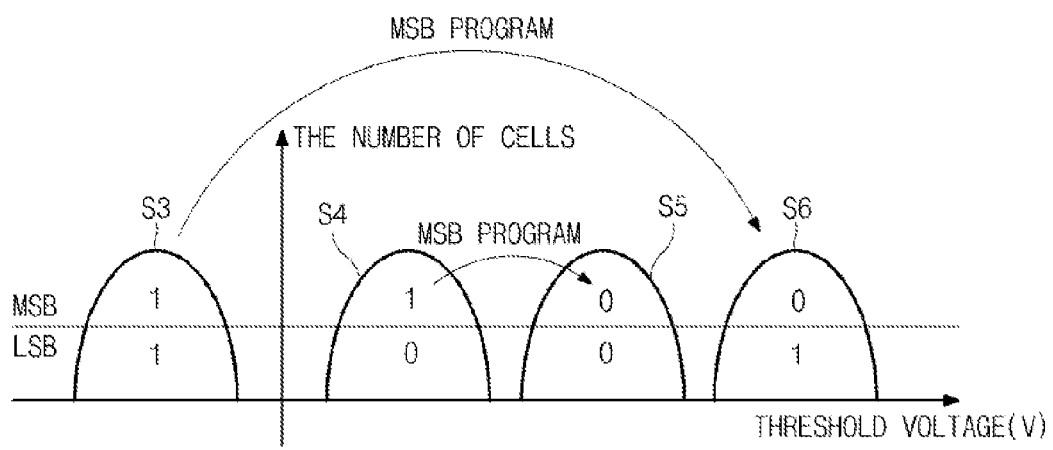

FIGS. 2A and 2B illustrate distribution of threshold voltages of memory cells to describe a scheme for programming pages according to an embodiment of the present invention.

FIG. 2A shows distribution of threshold voltages of memory cells for use in the SLC-based program that stores only one-bit data in one memory cell.

Referring to FIG. 2A, memory cells have a threshold voltage distribution corresponding to a state 51 and a threshold voltage distribution corresponding to a state S2 according to the SLC-based program. The 51 state represents a memory cell that is in an erase state and that a threshold voltage of the memory cell has a negative (−) value. The S2 state represents a memory cell that is in a program state and that a threshold voltage of the memory cell has a positive (+) value.

Data '0' is allocated to the erase state, and data '1' is allocated to the program state, so that one memory cell can store one-bit data therein. In this case, if a threshold voltage is changed from the negative value to the positive value, a corresponding memory cell can be programmed, so that the LSB program is carried out in a process where electrons are trapped into a floating gate of the memory cell.

FIG. 2B shows distribution of threshold voltages of memory cells for use in the MLC-based program that stores two-bit data in one memory cell.

Referring to FIG. 2B, a memory cell for use in the MLC-based program has four states S3, S4, S5, and S6.

In the MLC-based program, one memory cell includes an LSB region configured to store data of one bit and an MSB region configured to store data of another one bit. A process for programming the LSB region may be substantially the same as the SLC-based program shown in FIG. 2A.

For example, if data '1' is written in the LSB page, this corresponds to the S3 state and the S6 state. If data '0' is written in the LSB page, this corresponds to the S4 state and the S5 state. Memory cells staying in the S1 state shown in FIG. 2A may correspond to memory cells staying in the S3 state shown in FIG. 2B. If the memory cells staying in the S3 state are MSB-programmed, the memory cells change to the S6 state as shown in FIG. 2B.

If the memory cells staying in the S1 state are LSB-programmed as shown in FIG. 2A so as to change to the S2 state, the memory cells staying in the S3 state may be LSB-programmed to change to the S4 state as shown in FIG. 2B. Thereafter, if the memory cells staying in the S4 state are MSB-programmed once more, the memory cells change to the S5 state.

For the MLC-based program, it is noted that the MSB program is also performed after completion of the LSB program.

In conclusion, according to the SLC scheme, a small amount of data is written in one memory cell, which reduces a degree of integration, but requires a short programming time. However, in the non-volatile memory device and a method for operating the same according to an embodiment of the present invention, after sequential data is SLC-programmed during the chip activation period recognized as a write operation by a user so that the data is written through only one LSB program, if the background operation, which is not recognized by the user, starts in response to the chip idle signal chip_idle, some parts of SLC-programmed data are programmed in a second page, i.e., an MSB page, of a different memory block in such a manner that the copy-back operation is achieved. Therefore, through execution of the copy-back operation, a program time that the user can recognize may be reduced and a degree of integration can be increased during the background operation, such that a data write region to be used in a subsequent write operation can be guaranteed.

The LSB and MSB program schemes shown in FIGS. 2A and 2B are only disclosed for illustrative purposes, and other programming schemes can also be applied to an embodiment of the present invention without departing from the scope or spirit of the present invention.

Figures 3A, 3B:
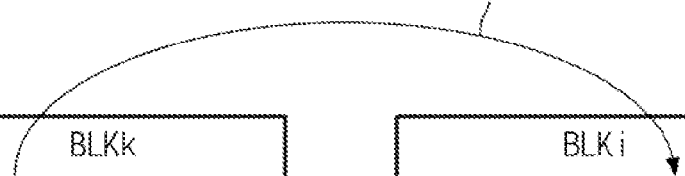
FIGS. 3A and 3B are conceptual diagrams illustrating a method for programming a non-volatile memory device according to an embodiment of the present invention.
Figure 4:
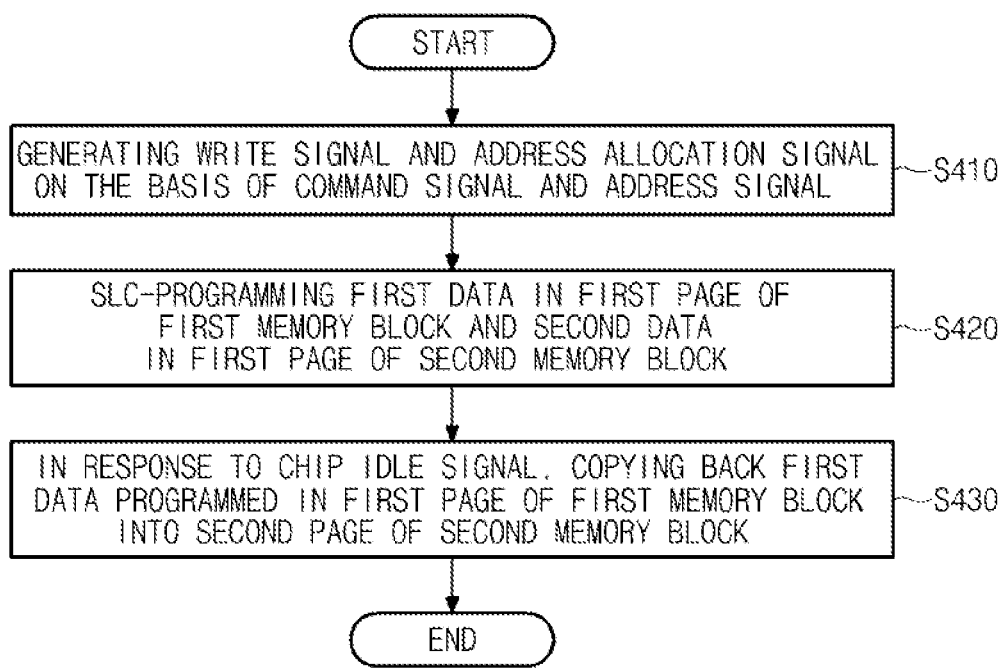
FIG. 4 is a flowchart illustrating a method for programming the non-volatile memory device shown in FIGS. 3A and 3B.

FIGS. 3A and 3B are conceptual diagrams illustrating a method for programming a non-volatile memory device according to an embodiment of the present invention. FIG. 4 is a flowchart illustrating a method for programming the non-volatile memory device shown in FIGS. 3A and 3B.

Referring to FIGS. 3A and 3B, each memory cell C0, . . . , or C11 includes an LSB region and an MSB region. LSB regions of the plurality of memory cells C0, . . . , and C11 are included in an LSB page. In a similar manner, MSB regions of the plurality of memory cells C0, . . . , and C11 are included in an MSB page.

Referring to FIGS. 1, 3A, 3B, and 4, the write controller 100 sequentially receives data from an external device, and generates a write signal write and an address allocation signal ALC on the basis of the command signal CMD and the address signal ADDR in step S410. The write signal write may be contained in the command signal CMD. Specific information for commanding data to be written in the LSB and MSB pages of an i-th memory block BLKi can be contained in the address signal ADDR. However, provided that the MLC-based program is performed during the chip activation period, a programming time for such is long, so that the write controller 100 generates the write mode signal Wmode in a manner that the i-th memory block BLKi and a k-th memory block BLKk contiguous to the i-th memory block BLKi are allocated and then SLC-programmed. In particular, the write mode signal Wmode is generated to perform the pseudo SLC buffer scheme.

Through the above-mentioned processes, first data is SLC-programmed in an LSB page of the k-th memory block BLKk, and second data is SLC-programmed in an LSB page of the i-th memory block BLKi in step S420. The first data and the second data are included in the data signal DATA received by the write controller 100.

After the LSB program is completed, the copy-back unit 400 receives the chip idle signal chip_idle so that the first data programmed in the LSB page of the k-th memory block BLKk is copied back into an MSB page of the i-th memory block BLKi in step S430 (see 301 in FIG. 3B). In this case, the process for copying back data of the k-th memory block BLKk into the i-th memory block BLKi includes an operation for reading out the data of the k-th memory block BLKk in response to the copy-back control signal CB_CON, an operation for temporarily storing the read-out data, and an operation for writing the stored data in the MSB page of the i-th memory block BLKi. Compared to the chip activation period, the above-mentioned operations are carried out according to the MSB program having a relatively long program time, so that a time required for such programming may be unavoidably increased.

As a result, as indicated by the initial address signal ADDR and the initial data signal DATA, data is programmed in each of the LSB page and the MSB page of the i-th memory block BLKi. A completion state of such programming is shown in FIG. 3B.

The data written in the k-th memory block BLKk may be erased during the copy-back operation, or may be erased before the data is actually written in the i-th memory block BLKi.

Although the above-mentioned operation is based on the MLC scheme, a memory block is SLC-programmed during the chip activation period so as to be used as a buffer, such that the above-mentioned program scheme is referred to as the pseudo SLC buffer scheme.

When using the pseudo SLC buffer scheme, although data is not directly programmed in a memory block, since the memory block is SLC-programmed during the chip activation period, a predetermined redundant space is needed for the memory block to temporarily store the data. For example, the space for memory blocks, which is twice the size of memory blocks where the data is finally programmed, are necessary to program the non-volatile memory device as shown in FIGS. 3A and 3B. In this way, a ratio of the number of memory blocks required for performing the above program process to the number of memory blocks needed to store the data therein is referred to as a Write Amplification Factor (WAF). For convenience of description, the WAF for use in the above-mentioned embodiment is set to 2. That is, although the data is finally written in the cell block BLKi, the cell blocks BLKi and BLKk are required to perform the pseudo SLC buffer scheme.

However, redundant or spare memory blocks may not be guaranteed during the program process. Therefore, in order to implement a trade-off relationship between the reduction of the program time and a guarantee of at least one redundant memory block, the write controller 100 generates the write mode signal Wmode to decide a program scheme of each memory block.

In other words, since the pseudo SLC buffer scheme is used, sequentially-received data pieces are first SLC-programmed in all memory blocks during the chip activation period. Thereafter, the SLC-programmed data is copied back through the MSB program in response to the chip idle signal chip_idle.

In accordance with another embodiment of the present invention, the LSB and MSB programs are performed in some memory cells during the chip activation period, so that data is MLC-programmed in LSB and MSB pages in one memory block. In addition, an additional copy-back operation may not be carried out even when the chip idle signal chip_idle is activated. If necessary, the above-mentioned pseudo SLC buffer scheme may be applied to some other memory cells.

The above-mentioned scheme can be utilized either when the number of redundant memory blocks is insufficient or when the stability of the entire non-volatile memory device is damaged due to the excessively increased copy-back time generated during the chip idle period.

FIGS. 5A and 5B are conceptual diagrams illustrating a method for programming a non-volatile memory device according to another embodiment of the present invention. In FIGS. 5A and 5B, each of memory cells C0, ..., and C11 includes an LSB region and an MSB region. An LSB page includes the LSB regions of the plurality of memory cells C0, ..., and C11, and an MSB page includes the MSB regions of the plurality the memory cells C0, ..., and C11.

Referring to FIGS. 1, 5A, and 5B, the write controller 100 sequentially receives data from an external device, and generates the write signal write and the address allocation signal ALC on the basis of the command signal CMD and the address signal ADDR. The write signal write may be included in the command signal CMD. Specific information for commanding data to be written in the LSB and MSB pages of an m-th memory block BLKm can be included in the address signal ADDR. However, provided that the MLC-based program is performed during the chip activation period, a programming time for such is long, so that the write controller 100 generates the write mode signal Wmode in a manner that an i-th memory block BLKi and a k-th memory block BLKk contiguous to the i-th memory block BLKi are allocated and then SLC-programmed. In particular, the write mode signal Wmode is generated to perform the pseudo SLC buffer scheme.

As shown in FIG. 5A, first data is programmed in an LSB page of the k-th memory block BLKk and second data is programmed in an LSB page of the i-th memory block BLKi. The first data and the second data are included in a data signal DATA received by the write controller 100.

Upon completion of the LSB program, the copy-back unit 400 receives the chip idle signal chip_idle, so that the first data programmed in the LSB page of the k-th memory block BLKk and the second data programmed in the LSB page of the i-th memory block BLKi are respectively copied back into an LSB page and an MSB page of the m-th memory block BLKm (see 501 and 502 in FIG. 5B. The copy-back unit 400 reads out the first data of the k-th memory block BLKk and the second data of the i-th block BLKi in response to the copy-back control signal CB_CON, and temporarily stores the first data and the second data. Then, the first data is written in the LSB page of the m-th memory block BLKm and the second data is written in the MSB page of the m-th memory block BLKm. Compared to the chip activation period, the above-mentioned operation is carried out by the MSB program with a relatively long program time, resulting in an increased programming time. Compared to the program method shown in FIGS. 3A and 3B, the program method shown in FIGS. 5A and 5B may need a longer data read-out time and a longer LSB program time. In addition, the WAF may be '3'.

The method for programming the non-volatile memory device as shown in FIGS. 5A and 5B combines the MLC scheme with the pseudo SLC buffer scheme in response to the write mode signal Wmode during the chip activation period.

Figure 6A:
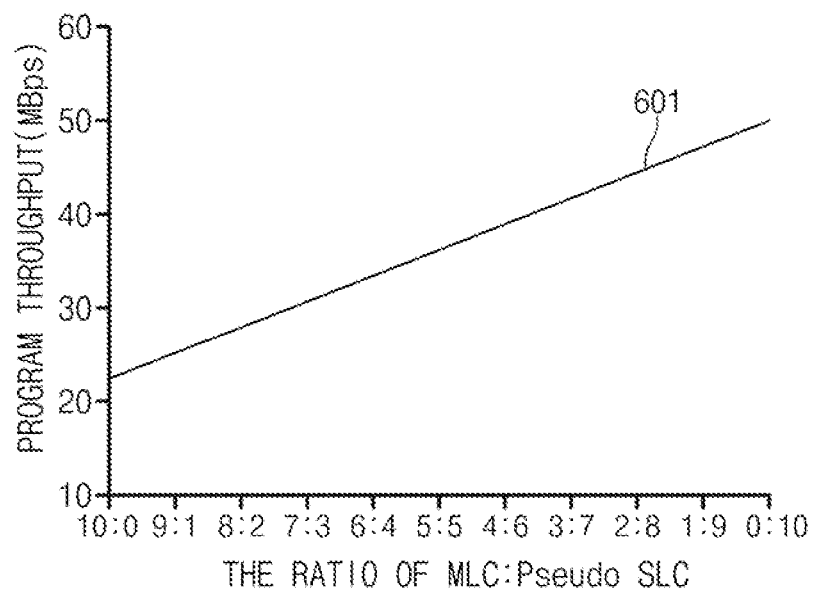
FIG. 6A is a graph illustrating a program throughput when an MLC scheme and a pseudo SLC buffer scheme are simultaneously used in response to a write mode signal.
Figure 6B:
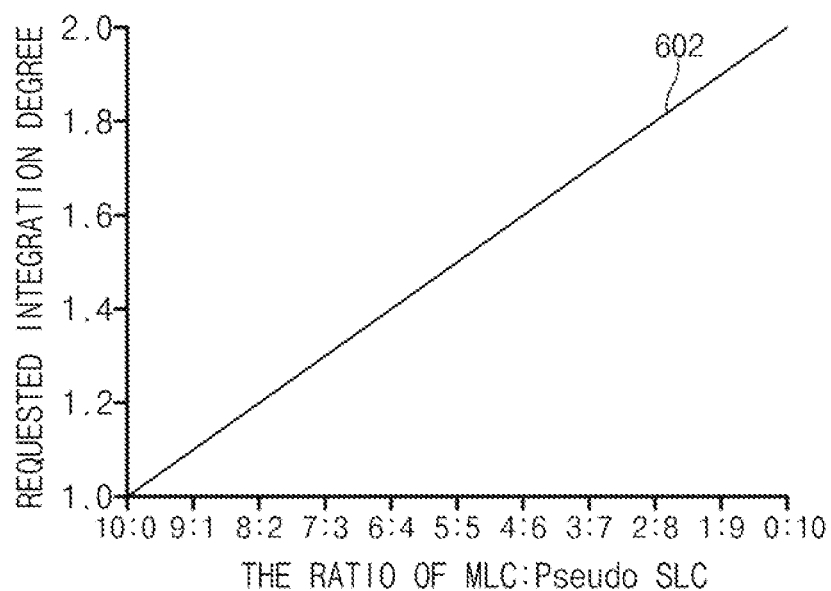
FIG. 6B is a graph illustrating a degree of integration requested for a non-volatile memory device when the MLC scheme and the pseudo SLC buffer scheme are simultaneously used.

FIG. 6A is a graph illustrating a program throughput when the MLC scheme and the pseudo SLC buffer scheme are simultaneously used in response to a write mode signal, and FIG. 6B is a graph illustrating a degree of integration requested for a non-volatile memory device when the MLC scheme and the pseudo SLC buffer scheme are simultaneously used.

In FIG. 6A, an X-axis denotes a ratio of the MLC scheme to the pseudo SLC scheme, and a Y-axis denotes a program throughput, i.e., a program speed, represented in units of MBps.

Referring to line 601 in FIG. 6A, if a memory block is programmed using only the MLC scheme, the program throughput is about 20 MBps. However, the program throughput gradually increases as a rate of the pseudo SLC scheme increases. If a memory block is programmed using only the pseudo SLC buffer scheme, the program throughput becomes about 50 MBps, which is about two times higher than that of the MLC-programmed memory block.

In FIG. 6B, an X-axis denotes a ratio of the MLC scheme to the pseudo SLC scheme, and a Y-axis denotes a requested degree of integration, i.e., a ratio of memory blocks required for such programming.

Referring to line 602 in FIG. 6B, when using only the MLC scheme, the ratio of memory blocks is set to 1 in such a manner that the resultant ratio becomes identical to a degree of integration of the entire memory cell array 300. However, the number of additionally requested memory blocks increases as a rate of the pseudo SLC buffer scheme increases. The number of memory blocks used in the pseudo SLC buffer scheme is two times that of the MLC scheme.

In the case of using only the pseudo SLC buffer scheme, memory blocks in the memory cell array 300 are used like an SLC buffer so that the program speed can be improved. However, since the number of memory blocks in the memory cell array 300 is limited, the number of memory blocks required for the pseudo SLC buffer scheme becomes two times that of the MLC scheme during the chip activation period.

In conclusion, the write controller 100 can generate the write mode signal Wmode in consideration of the program throughput and the degree of integration of the memory cell array 300 shown in FIGS. 6A and 6B.

As described above, the non-volatile memory device according to the embodiments of the present invention performs the LSB program in a memory cell array during a chip activation period. Upon receiving a chip idle signal, the non-volatile memory device moves LSB-programmed data to other memory cells through the MSB program. As a result, the program speed can be improved during the chip activation period.

The method for programming the non-volatile memory according to the embodiments of the present invention uses some memory blocks acting as an SLC buffer, and can control each memory block to be MLC-programmed even in the chip activation period in consideration of a redundant space of the memory block, resulting in flexibility in program time of the non-volatile memory device and flexibility in space utilization of each memory block.

As is apparent from the above description, during the sequential write operation of sequentially-received data, after the data is written in a memory cell included in a memory cell array using the SLC scheme, the data write operation is completed using the MLC scheme during the background operation in such a manner that the memory cell array can be used as an SLC buffer, and a problem encountered by the limited capacity of the SLC buffer can be obviated.

The non-volatile memory device according to the embodiments of the present invention first stores data in an SLC buffer and then writes the data in memory cells, so that a problem where a data write time is limited in response to the capacity of the SLC buffer can be solved, and the sequential write throughput can be improved at least three times.

The method for programming the non-volatile memory device according to the embodiments of the present invention can select one program scheme of a pseudo SLC buffer scheme and an MLC scheme on the basis of a redundant space contained in a memory cell array, resulting in flexibility of the program operation.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
    first and second memory blocks, each of which includes a plurality of memory cells, each memory cell including a plurality of regions in which data is written, corresponding regions of the plurality of memory cells constituting a page;
    a data write unit, upon receiving a write signal and an address allocation signal, configured to write first data in a first page of the first memory block, and write second data in a first page of the second memory block; and
    a copy-back unit, upon receiving a chip idle signal and a copy-back control signal, configured to write the first data written in the first memory block into a second page of the second memory block.

2. The non-volatile memory device according to claim 1, wherein the first page includes a least significant bit (LSB) region of each cell of the plurality of memory cells, and the second page includes a most significant bit (MSB) region of said each cell of the plurality of memory cells.

3. The non-volatile memory device according to claim 1, wherein the first memory block and the second memory block are contiguous to each other.

4. The non-volatile memory device according to claim 1, further comprising:
    a write controller configured to generate the address allocation signal based on an address signal to allocate the first data to the first memory block and the second data to the second memory block.

5. The non-volatile memory device according to claim 4, wherein the write controller is configured to generate a write mode signal to determine a scheme for writing data in the memory blocks based on the address signal and a command signal including the write signal.

6. The non-volatile memory device according to claim 5, wherein the write mode signal is generated to determine the number of pages used when data is written in the memory blocks.

7. The non-volatile memory device according to claim 6, wherein:
    if data is written in a single page of a memory block, the data write unit is configured to determine the memory block to be a single level cell (SLC) buffer, and if the data is written in a plurality of pages of the memory block, the data write unit is configured to determine the memory block to be a multi level cell (MLC), such that the data write unit performs a data write operation.

8. The non-volatile memory device according to claim 1, wherein the chip idle signal is included in the command signal, or the write controller is configured to generate the chip idle signal if the command signal is not input thereto for a predetermined time.

9. A non-volatile memory device comprising:
    first to third memory blocks, each of which includes a plurality of memory cells, each memory cell including a plurality of regions in which data is sequentially written, corresponding regions of the plurality of memory cells constituting a page;
    a data write unit, upon receiving a write signal and an address allocation signal, configured to write first data in a first page of the first memory block, and write second data in a first page of the second memory block; and a copy-back unit, upon receiving a chip idle signal and a copy-back control signal, configured to write the first data written in the first memory block and the second data written in the second memory block in a first page and a second page of the third memory block, respectively.

10. The non-volatile memory device according to claim 9, wherein the first page includes a least significant bit (LSB) region of each cell of the plurality of memory cells, and the second page includes a most significant bit (MSB) region of said each cell of the plurality of memory cells.

11. The non-volatile memory device according to claim 9, further comprising:

a write controller configured to generate the address allocation signal based on an address signal to allocate the first data to the first memory block and the second data to the second memory block, generate a write mode signal to determine a scheme for writing data in the memory blocks upon receiving the address signal and a command signal including a read signal, and generate the copy-back control signal based on the address signal.

12. The non-volatile memory device according to claim 11, wherein:

the write mode signal is generated to enable data to be written in each of the memory blocks using a pseudo single level cell (SLC) buffer scheme or a multi level cell (MLC) scheme, and the write controller is configured to determine a ratio of the pseudo SLC buffer scheme to the MLC scheme for the memory blocks based on the write mode signal.

13. A method for programming a non-volatile memory device including a plurality of memory blocks, each of which includes a plurality of memory cells, each memory cell including a plurality of regions in which data is sequentially written, corresponding regions of the plurality of memory cells constituting a page, the method comprising:

providing, by a write controller, a write signal and an address allocation signal based on a command signal and an address signal;

sequentially writing, by a data writing unit, data in a first page of a first memory block and a first page of a second memory block in response to the write signal and the address allocation signal; and copying-back, by a copy-back unit, the data written in the first page of the first memory block into a second page of the second memory block in response to a chip idle signal and a copy-back control signal.

14. The method according to claim 13, further comprising:
generating, by the write controller, the chip idle signal based on the command signal.

15. The method according to claim 13, further comprising:
generating, by the write controller, a write mode signal to determine a scheme for writing data in each of the memory blocks, and
performing, by the data writing unit and the copy-back unit, the steps of sequentially writing the data and copying-back the data, respectively, if the memory blocks are programmed using a pseudo single level cell (SLC) buffer scheme in response to the write mode signal.

16. The method according to claim 13, wherein copying-back the data includes:
reading out the data written in the first memory block; and
performing Most Significant Bit (MSB) programming on the read-out data into the second page of the second memory block.

17. A method for programming a non-volatile memory device including a plurality of memory blocks, each of which includes a plurality of memory cells, each memory cell including a plurality of regions in which data is sequentially written, corresponding regions of the plurality of memory cells constituting a page, the method comprising:

providing, by a write controller, a write signal and an address allocation signal based on a command signal and an address signal;

sequentially writing, by a data writing unit, data in a first page of a first memory block and a first page of a second memory block in response to the write signal and the address allocation signal; and copying-back, by a copy-back unit, the data written in the first pages of the first and second memory blocks into first and second pages of a third memory block, respectively, in response to a chip idle signal and a copy-back control signal.

18. The method according to claim 17, wherein copying-back the data includes:
reading out the data written in the first page of the first memory block and the data written in the first page of the second memory block, respectively;
performing Least Significant Bit (LSB) programming on the data read out of the first page of the first memory block into the first page of the third memory block; and
performing Most Significant Bit (MSB) programming on the data read out of the first page of the second memory block into the second page of the third memory block.

19. The method according to claim 18, wherein copying-back the data further comprises:
erasing the data written in the first and second memory blocks.

20. The method according to claim 18, wherein the first page includes a least significant bit (LSB) region of each cell of the plurality of memory cells, and the second page includes a most significant bit (MSB) region of said each cell of the plurality of memory cells.

* * * * *